United States Patent
Amarú et al.

(10) Patent No.: US 9,685,959 B2
(45) Date of Patent: Jun. 20, 2017

(54) METHOD FOR SPEEDING UP BOOLEAN SATISFIABILITY

(71) Applicant: ECOLE POLYTECHNIQUE FEDERALE DE LAUSANNE (EPFL), Lausanne (CH)

(72) Inventors: Luca Gaetano Amarú, Jouxtens-Mézery (CH); Pierre-Emmanuel Julien Marc Gaillardon, Renens (CH); Giovanni De Micheli, Lausanne (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 14/851,131

(22) Filed: Sep. 11, 2015

(65) Prior Publication Data
US 2016/0077154 A1  Mar. 17, 2016

Related U.S. Application Data

(60) Provisional application No. 62/049,435, filed on Sep. 12, 2014.

(51) Int. Cl.
*G06F 9/455* (2006.01)
*G06F 17/50* (2006.01)
*H03K 19/20* (2006.01)

(52) U.S. Cl.
CPC .................................... *H03K 19/20* (2013.01)

(58) Field of Classification Search
CPC . H03K 19/20; G06F 11/3604; G06F 11/3608; G06F 11/3636; G06F 11/3684; G06F 17/504
See application file for complete search history.

(56) References Cited

U.S. PATENT DOCUMENTS 5,276,897 A     1/1994  Stalmarck
2003/0195873 A1*  10/2003  Lewak .............. G06F 17/30389
(Continued)

OTHER PUBLICATIONS

Sharad Malik et al., "Logic Verification using Binary Decision Diagrams in a Logic Synthesis Environment," Department of Engineering and Computer Sciences—University of California, Copyright 1988, pp. 6-9.
(Continued)

*Primary Examiner* — Nha Nguyen
(74) *Attorney, Agent, or Firm* — Nixon & Vanderhye PC

(57) ABSTRACT

A method for transforming a tautology check of an original logic circuit into a contradiction check of the original logic circuit and vice versa comprises interpreting the original logic circuit in terms of AND, OR, MAJ, MIN, XOR, XNOR, INV original logic operators; transforming the original circuit obtained from the interpreting, into a dual logic circuit enabled for a checking of contradiction in place of tautology and vice versa, by providing a set of switching rules configured to switch each respective one of the original logic operators INV, AND, OR, MAJ, XOR, XNOR, MIN into a respective switched logic operator INV, OR, AND, MAJ, XNOR, XOR, MIN; and complementing outputs of the original circuit by adding an INV at each output wire. The method further provides testing in parallel the satisfiability of the original logic circuit, and the satisfiability of the dual logic circuit with inverted outputs. Responsive to one of the parallel tests finishing, the other parallel test is caused to also stop.

4 Claims, 5 Drawing Sheets

(56) References Cited

U.S. PATENT DOCUMENTS

| | | | | | |
|---|---|---|---|---|---|
| 2005/0240885 | A1* | 10/2005 | Ganai | ............... | G06F 17/504 716/103 |
| 2013/0246080 | A1* | 9/2013 | Abadi | ............... | G06Q 40/08 705/2 |
| 2014/0047217 | A1* | 2/2014 | Li | ............ | G06F 9/5027 712/216 |

OTHER PUBLICATIONS

Antti E. J. Hyvärinen et al., "Incorporating Clause Learning in Grid-Based Randomized SAT Solving," Journal on Satisfiability, Boolean Modeling and Computation 6, Jun. 2009, pp. 223-244.

Luca Amarú et al., "Majority-Inverter Graph: A Novel Data-Structure and Algorithms for Efficient Logic Optimization," Proc. DAC, Jun. 2014, 6 pages.

Gary D. Hachtel et al., "Verification Algorithms for VLSI Synthesis," IEEE Transactions on Computer-Aided Design, vol. 7, No. 5, May 1988, pp. 616-640.

Integrated Systems Laboratory (LSI), "Exploiting Circuit Duality to Speed up SAT," retrieved Sep. 11, 2015, 1 page.

Niklas Eén et al., "The MiniSAT Page," retrieved Sep. 11, 2015, pp. 1-3. http://minisat.se/MiniSat.html.

AIGER Benchmarks, retrieved Sep. 11, 2015, pp. 1-4. http://fmv.jku.at/aiger/.

The International SAT Competitions Web Page, retrieved Sep. 11, 2015, pp. 1-3. http://www.satcompetition.org/.

Richard L. Rudell et al., "Multiple-Valued Minimization for PLA Optimization," IEEE Transactions on Computer-Aided Design, vol. CAD-6, No. 5, Sep. 1987, pp. 727-750.

ABC: A System for Sequential Synthesis and Verification, Berkeley Logic Synthesis and Verification Group, retrieved Sep. 11, 2015, 1 page.

Luca Benini et al., "A Survey of Boolean Matching Techniques for Library Binding," ACM Transactions on Design Automation of Electronic Systems, vol. 2, No. 3, Jul. 1997, pp. 193-226.

Randal E. Bryant et al., "Graph-Based Algorithms for Boolean Function Manipulation," IEEE Transactions on Computers, vol. C-35, No. 8, Aug. 1986, pp. 677-691.

* cited by examiner

TABLE I: Switching Rules for Tautology/Contradiction Check

| Original Logic Operator | Switched Logic Operator |
|---|---|
| INV | INV |
| AND | OR |
| OR | AND |
| MAJ | MAJ |
| XOR | XNOR |
| XNOR | XOR |

TABLE II: Experimental Results for Regular vs. Dual SAT Solving
All runtimes are in seconds

| Benchmark | I/O | Logic Size | Logic Depth | Runtime Regular | Runtime Dual | Δ Runtime | Best Runtime |
|---|---|---|---|---|---|---|---|
| hardsat1 | 4580/1 | 283539 | 392 | 186.35 | 58.9 | 127.35 | 58.9 |
| hardsat2 | 4580/1 | 287635 | 392 | 51.1 | 191.87 | 140.77 | 51.1 |
| hardsat3 | 198540/1 | 920927 | 267 | 0.94 | 1.1 | 0.16 | 0.94 |
| hardsat4 | 2452/1 | 43962 | 436 | 68.82 | 20.53 | 48.29 | 20.53 |
| hardsat5 | 5725/1 | 562027 | 464 | 40.91 | 22.72 | 18.19 | 22.72 |
| hardsat6 | 3065/1 | 86085 | 437 | 37.51 | 64.24 | 26.73 | 37.51 |
| hardsat7 | 372240/1 | 85596 | 151 | 4.8 | 3.68 | 1.12 | 3.68 |
| Total *sat* | 591182/7 | 2269771 | 2539 | 390.43 | 363.04 | 27.39 | 195.38 |
| hardunsat1 | 61/1 | 448884 | 2181 | 26.72 | 27.22 | 0.50 | 26.72 |
| hardunsat2 | 61/1 | 264263 | 2951 | 3.70 | 1.32 | 2.38 | 1.32 |
| hardunsat3 | 61/1 | 451350 | 2181 | 27.8 | 20.33 | 7.47 | 20.33 |
| hardunsat4 | 540/1 | 244660 | 1158 | 234.88 | 326.84 | 91.96 | 234.88 |
| hardunsat5 | 2352/1 | 208221 | 439 | 7.61 | 7.65 | 0.04 | 7.65 |
| hardunsat6 | 550/1 | 117820 | 423 | 142.28 | 137.94 | 4.34 | 137.94 |
| Total *unsat* | 3625/6 | 1735198 | 9333 | 442.99 | 521.30 | 78.31 | 428.80 |
| Total | 594807/13 | 4004969 | 11872 | 833.42 | 884.34 | 50.84 | 624.18 |
| Norm. to Regular | — | — | — | 1.000 | 1.0606 | — | 0.75 |

FIG. 8

METHOD FOR SPEEDING UP BOOLEAN SATISFIABILITY

This application claims the benefit of U.S. Provisional Application No. 62/049,435 filed Sep. 12, 2014, the entire content of which is hereby incorporated by reference.

TECHNICAL FIELD

The invention is in the field of logic circuits.

BACKGROUND

Inspecting the properties of logic circuits is pivotal to logic applications for computers and especially to Electronic Design Automation (EDA) [1]. There exists a large variety of properties to be checked in logic circuits, e.g., unateness, linearity, symmetry, balancedness, monotonicity, thresholdness and many others [2]. Basic characteristics are usually verified first to provide grounds for more involved tests. Tautology and contradiction are the most fundamental properties in logic circuits. A check for tautology determines if a logic circuit is true for all possible input patterns. Analogously, a check for contradiction determines if a logic circuit is false for all possible input patterns. While investigating elementary properties, tautology and contradiction check are difficult problems, i.e., co-NP-complete and NP-complete, respectively [3]. Indeed, both tautology and contradiction check are equivalent formulation of the Boolean SATisfiability (SAT) problem [3]. In this scenario, new efficient algorithms for tautology/contradiction check are key to push further the edge of computational limits, enabling larger logic circuits to be examined.

Tautology and contradiction check are dual problems. One can interchangeably check for tautology in place of contradiction by inverting all outputs in a logic circuit. In this trivial approach, the two obtained problems are fully complementary and there is no explicit computational advantage in solving one problem instead of the other.

In the present description, we show that exact logic inversion is not necessary for transforming tautology into contradiction, and vice versa. We give a set of operator switching rules that selectively exchange tautologies with contradictions. A logic circuit modified by our rules is inverted just if identically true or false for all input combinations. In the other cases, it is not necessarily the complement of the original one. In a simple logic circuit made of AND, OR and INV logic operators, our switching rules swap AND/OR operator types. We give a set of rules for general logic circuits in the rest of this paper. Note that in this paper we mostly deal with single output circuits. For multi-output circuits, the same approach can be extended by ORing (contradiction) or ANDing (tautology) the outputs that need to be checked into a single one.

Parallel checking techniques are known from prior art. For example, one can launch in parallel many randomized check runs on the same problem instance with the aim to hit the instance-intrinsic minimum runtime [4]

SUMMARY OF THE INVENTION

The invention provides a method for transforming a tautology check of an original logic circuit into a contradiction check of the original logic circuit and vice versa. The method comprises interpreting the original logic circuit in terms of AND, OR, MAJ, MIN, XOR, XNOR, INV original logic operators; transforming the original circuit obtained from the interpreting, into a dual logic circuit enabled for a checking of contradiction in place of tautology and vice versa, by providing a set of switching rules configured to switch each respective one of the original logic operators INV, AND, OR, MAJ, XOR, XNOR, MIN into a respective switched logic operator INV, OR, AND, MAJ, XNOR, XOR, MIN; and complementing outputs of the original circuit by adding an INV at each output wire. The method further provides testing in parallel the satisfiability of the original logic circuit, and the satisfiability of the dual logic circuit with inverted outputs. Responsive to one of the parallel tests finishing, the other parallel test is caused to also stop.

In a preferred embodiment the method further comprises responsive to testing that confirms the satisfiability of the original logic circuit and the satisfiability of the dual logic circuit with inverted outputs, configuring the transformed logic for use in a computer system.

An approach taken with the present invention generates two different, but equi-solvable, instances of the same problem. In this scenario, solving both of them in parallel enables a positive computation speed-up. Indeed, the instance solved first stops the other reducing the runtime. This concept can be used on top of any other checking approach and does not impose much overhead, except having to run two solvers instead of one, which is typically not a problem because multi-cores are wide-spread and computing resources are inexpensive.

In contrast to known parallel checking techniques, the methodology adopted through the invention creates a different but equi-checkable instance that has a potentially lower minimum runtime. As a case study, in the section describing preferred embodiments herein under, we investigate the impact of the inventive approach on SAT. There, by using non-trivial and trivial dualities in sequence, we create a dual SAT instance solvable in parallel with the original one. Experimental results show 25% speed-up of SAT, on average, in a concurrent execution scenario. Also, statistical experiments confirmed that the achieved runtime reduction is not of the random variation type.

BRIEF DESCRIPTION OF THE DRAWINGS

The invention will be better understood in view of the description of preferred example embodiments and in reference to the drawings, wherein

FIG. 8 (table II) contains experimental results for regular vs. dual SAT solving.

DESCRIPTION OF PREFERRED EXAMPLE EMBODIMENTS

Notation on Logic Circuits

This section first provides notation on logic circuits. Then, it gives a brief background on tautology checking from an EDA perspective.

A. Notation

Figure 1:
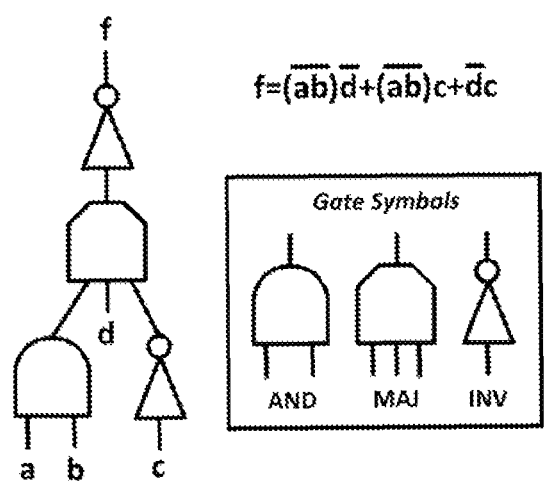
FIG. 1 represents a logic circuit example representing the function $f=\overline{(ab)}\overline{d}+\overline{(ab)}c+\overline{d}c$. The basis set is {AND, MAJ, INV}. The gates symbolic representation is shown in the box.

A logic circuit is a Directed Acyclic Graph (DAG) representing a Boolean function, with nodes corresponding to logic gates and directed edges corresponding to wires connecting the gates. The on-set of a logic circuit is the set of input patterns evaluating to true. Analogously, the off-set of a logic circuit is the set of input patterns evaluating to false. Each logic gate is associated with a primitive Boolean function taken from a predefined set of basis logic operators, e.g., AND, OR, XOR, XNOR, INV, MAJ, MIN etc. Logic operators such as MAJ and MIN represent self dual Boolean functions, i.e., functions whose output complementation is equivalent to inputs complementation. A set of basis logic operators is said to be universal if any Boolean function can be represented by a logic circuit equipped with those logic gates. For example, the basis set {OR, INV} is universal while the basis set {AND, MAJ} is not. FIG. 1 shows a logic circuit for the function $$f=(ab)d+(ab)c+dc$$

over the universal basis set {AND, MAJ, INV}.

B. Tautology Checking

Tautology checking, i.e., verifying whether a logic circuit is true in every possible interpretation, is an important task in computer science and at the core of EDA [5], [7]. Traditionally, tautology checking supports digital design verification through combinational equivalence checking [7]. Indeed, the equivalence between two logic circuits can be detected by XNOR-ing and checking for tautology. Logic synthesis also uses tautology checking to (i) highlight logic simplifications during optimization [5], [6] and to (ii) identify matching during technology mapping [8].

On a general basis, many EDA tasks requiring automated deduction are solved by tautology check routines.

Unfortunately, solving a tautology check problem can be a difficult task. In its most general formulation, the tautology check problem is co-NP-complete. A straightforward method to detect a tautology is the exhaustive exploration of a function truth table. This naive approach can declare a tautology only in exponential runtime. More intelligent methods have been developed in the past. Techniques based on co-factoring trees and binary recursion have been presented in [9]. Together with rules for pruning/simplifying the recursion step, these techniques reduced the checking runtime on several benchmarks. Another method, originally targeting propositional formulas, is Stalmarck's method [10] that rewrites a formula with a possibly smaller number of connectives. The derived equivalent formula is represented by triplets that are propagated to check for tautology. Unate recursive co-factoring trees and Stalmarck's method are as bad as any other tautology check method in the worst case but very efficient in real-life applications. With the rise of Binary Decision Diagrams (BDDs) [11], tautology check algorithms found an efficient canonical data structure explicitly showing the logic feature under investigation [12]. The BDD for a tautology is always a single node standing for the logic constant true. Hence, it is sufficient to build a BDD for a logic circuit and verify the resulting graph size (plus the output polarity) to solve a tautology check problem. Unfortunately, BDDs can be exponential in size for some functions (multipliers, hidden-weight bit, etc.). In the recent years, the advancements in SAT solving tools [13], [14] enabled more scalable approaches for tautology checking. Using the trivial duality between tautology and contradiction, SAT solvers can be used to determine if an inverted logic circuit is unsatisfiable (contradiction) and consequently if the original circuit is a tautology. Still, SAT solving is an NP-complete problem so checking for tautology with SAT is difficult in general.

C. Motivation

Tautology checking is a task surfing the edge of today's computing capabilities. Due to its co-NP-completeness, tautology checking aggressively consumes computational power when the size of the problem increases. To push further the boundary of examinable logic circuits, it is important to study new efficient checking methodologies. Indeed, even a narrow theoretical improvement can generate a speed-up equivalent to several years of technology evolution.

In the present description, we present a non-trivial duality between contradiction and tautology check problems that opens up new efficient solving opportunities.

Properties of Logic Circuits

In this section, we show properties of logic circuits with regard to their on-set/off-set balance and distribution. These theoretical results will serve as grounds for proving our main assertion in the next section.

We initially focus on two universal basis sets: {AND, OR, INV} and {MAJ, INV}. We deal with richer basis sets later on. We first recall a known fact about majority operators.

Property:

A MAJ operator of n-variables, with n odd, can be configured as an $\lceil n/2 \rceil$-variables AND operator by biasing $\lfloor n/2 \rfloor$ inputs to logic false and can be configured as an $\lceil n/2 \rceil$-variables OR operator by biasing $\lfloor n/2 \rfloor$ inputs to logic true.

Figure 2:
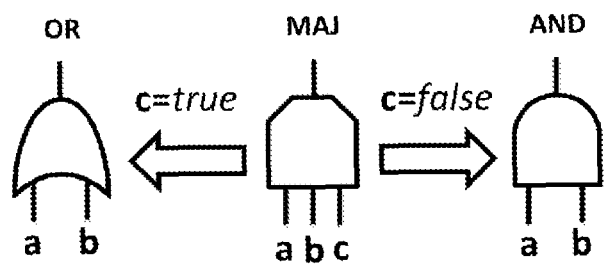
FIG. 2 represents an AND/OR configuration of a three-input MAJ.

For the sake of clarity, an example of a three-input MAJ configuration in AND/OR is depicted by FIG. 2.

Extended at the circuit level, such property enables the emulation of any {AND, OR, INV} logic circuit by a structurally identical {MAJ, INV} logic circuit. This result was previously shown in [15] where logic circuit over the basis set {AND, OR, INV} are called AND/OR-INV graphs and logic circuits over the basis set {MAJ, INV} are called MAJ-INV graphs. An example of two structurally, and functionally, identical logic circuits over the basis sets {AND, OR, INV} and {MAJ, INV} is depicted by FIG. 3(*a*) and FIG. 3(*b*).

The Boolean function represented in this example is f=ab+ac+a(b+c)+a. MAJ are configured to behave as AND/OR by fixing one input to false(F)/true(T), respectively. In place of biasing one input of the MAJ with a logic constant, it is also possible to introduce a fictitious input variable connected in regular/inverted polarity to substitute true(T)/false(F) constants, respectively. In this way, the function represented is changed but still including the original one when the fictitious input variable is assigned to true. FIG. 3(*d*) shows a logic circuit with a fictitious input variable d replacing the logic constants in FIG. 3(*b*). The Boolean function represented there is h with property ha=true=f.

Up to this point, we have shown that {AND, OR, INV} logic circuits can be emulated by {MAJ, INV} logic circuits configured either by
  (i) logic constants or by
  (ii) a fictitious input variable.
In the latter case, {MAJ, INV} logic circuits have all inputs assignable.

With no logic constants appearing and all operators being self-dual, this particular class of logic circuits have a perfectly balanced on-set/off-set size. The following theorem formalizes this property.

Theorem 3.1:
Logic circuits over the universal basis set {MAJ, INV}, with all inputs assignable (no logic constants), have |on-set|=2n−1 and |off-set|=2n−1, with n being the number of input variables.

Proof:
MAJ and INV logic operators, with no constants, represent self-dual Boolean functions. In [2], it is shown that self-dual Boolean functions have an |on-set|=|off-set|=$2^{n-1}$, with n being the number of input variables. Also, it is shown in [2] that Boolean functions composed by self-dual Boolean functions are self-dual as well. This is indeed the case for {MAJ, INV} logic circuits with no constants in input. As these circuits represent self-dual Boolean functions, we can assert |on-set|=|off-set|=$2^{n-1}$. Q.E.D.

{MAJ, INV} logic circuits with no constants have a perfectly balanced partition between on-set size and off-set size. This is the case for the example in FIG. 3(d). Eventually, we know that by assigning d to true in such example circuit the on-set/off-set balance can be lost. Indeed, with d=true the {MAJ, INV} logic circuit then emulates the original {AND, OR, INV} logic circuit in FIG. 3(a), that could have different on-set size and off-set size. Still, it is possible to reclaim the perfect on-set/off-set balance by superposing the cases d=true and d=false in the {MAJ, INV} logic circuit. While we know precisely what the {MAJ, INV} logic circuit does when d=true, the case d=false is not as evident. We can interpret the case d=false as an inversion in the MAJ configuration polarity. This means that where a MAJ is configured as an AND (OR) node in d=true, it is instead configured as an OR (AND) node in d=false. In other words, d=false in the {MAJ, INV} logic circuit of FIG. 3(d) corresponds to switch AND/OR operator types in the original {AND, OR, INV} logic circuit of FIG. 3(a). The resulting AND/OR switched circuit is depicted by FIG. 3(c).

United by a common {MAJ, INV} generalization, {AND, OR, INV} logic circuits and their AND/OR switched versions share strong properties about on-set/off-set repartition. The following theorem states their relation.

Theorem 3.2:
Let A be a logic circuit over the universal basis set {AND, OR, INV}. Let A' be a modified version of A, with AND/OR operators switched. The following identities hold |on-set (A)|=|off-set(A')| and |off-set(A)|=|on-set(A')|.

Proof:
Say M a {MAJ, INV} logic circuit emulating A using an extra fictitious input variable, say d. Md=1 is structurally and functionally equivalent to A, while Md=0 is structurally and functionally equivalent to A'. From Theorem 3.1 we know that $$|on\text{-}set(M)|=|off\text{-}set(M)|=2^{n-1}=2^m,$$

where m is the number of input variables in A and n the number of input variables in M, with n=m+1 to take into account the extra fictitious input variable in M. We know by construction that $$|on\text{-}set(Md=1)|+|on\text{-}set(Md=0)|=2^{n-1}=2^m \text{ and}$$

$$|off\text{-}set(Md=1)|+|off\text{-}set(Md=0)|=2^{n-1}=2^m.$$

Again by construction we know that Md=1 and Md=0 can be substituted by A and A', respectively, in all equations. Owing to the basic definition of A and A' we have that $$|on\text{-}set(A)|+|off\text{-}set(A)|=2^m \text{ and}$$

$$|on\text{-}set(A')|+|off\text{-}set(A')|=2^m.$$

Expressing |on-set(A)| as $2^m$−|on-set(A')| from the first set of equations and substituting this term in |on-set(A)|+|off-set(A)|=2m we get $2^m$−|on-set(A')|+|off-set(A)|=$2^m$ that can be simplified as |off-set(A)|=|on-set(A')|. This proves the first identity of the Theorem. The second identity can be proved analogously.

Informally, the previous theorem says that by switching AND/OR operators in an {AND, OR, INV} logic circuit we swap the on-set and off-set sizes. From a statistical perspective, this is equivalent to invert Pr(A=true) with Pr(A=false), under uniformly random input string of bits. While this also happens with exact logic inversion, here the actual distribution of the on-set/off-set elements is not necessarily complementary. In the next section, we show the implications of the theoretical results seen so far in tautology and contradiction check problems.

From Tautology to Contradiction and Back
Verifying whether a logic circuit is a tautology, a contradiction or a contingency is an important task in logic applications for computers. In this section, we show that tautology and contradiction check in logic circuits are dual and interchangeable problems that do not require exact logic inversion per se. We start by considering logic circuit over the universal basis set {AND, OR, INV} and we consider richer basis sets later on. The following theorem describes the non-trivial duality between tautology and contradiction in {AND, OR, INV} logic circuits.

Theorem 4.1:
let A be a logic circuit over the universal basis set {AND, OR, INV} representing a tautology (contradiction). The logic circuit A', obtained by switching AND/OR operations in A, represents a contradiction (tautology).

Proof:
if A represents a tautology then $$|on\text{-}set(A)|=2^m \text{ and}$$

$$|on\text{-}set(A)|=0$$

with m being the number of inputs. Owing to Theorem 3.2

$$|on\text{-}set(A')|=|off\text{-}set(A)|=0 \text{ and}$$

$$|off\text{-}set(A')|=|on\text{-}set(A)|=2^m.$$

It follows that A' is a contradiction. Analogous reasoning holds for contradiction to tautology transformation. Q.E.D.

Figures 4, 7:
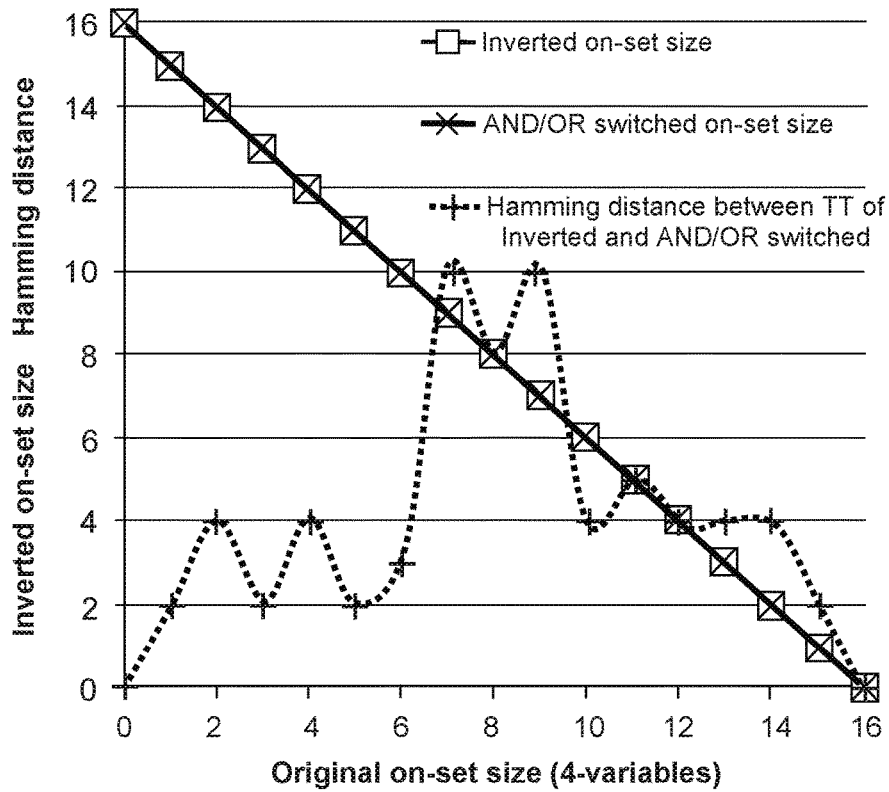
FIG. 4 is a graph of a comparison between real inverted and AND/OR switched logic circuits representing 4-variable Boolean functions. The on-set size ranges from 0 to $2^4$.
FIG. 7 (table I) contains switching rules for Tautology/Contradiction Check.

Switching AND/ORs in an {AND, OR, INV} logic circuit is strictly equivalent to logic inversion only for tautology and contradiction. In the other cases, A and A' are not necessarily complementary. We give empirical evidences about this fact hereafter. FIG. 4 depicts the obtained results in a graph chart. We examined 17 random Boolean functions of four input variables, with on-set size ranging from 0 (contradiction) to 16 (tautology). We first compared the on-set size of the real inverted logic circuits with the on-set size of the AND/OR switched circuits. As expected, Theorem 3.2 holds and switching AND/OR operators results in exchanging the on-set and off-set sizes. This also happens with the real inverted circuits, but in that case also the actual on-set/off-set elements distribution is complementary. To verify what is the on-set/off-set elements distribution in general, we define a distance metric between the real inverted and AND/OR switched circuits. The distance metric is computed in two steps. First, the truth tables of the circuits are unrolled, using the same input order, and represented as binary strings. Second, the distance metric is measured as the Hamming distance 3 between those binary strings. For tautology and contradiction extremes the distance metric between AND/OR switched circuits and real inverted circuits is 0, as obvious consequence of Theorem 4.1. For other circuits, real inverted and AND/OR switched circuits are different, with distance metric ranging between 2 and 10.

As a practical interpretation of the matter discussed so far, we can get an answer for a tautology (contradiction) check problem by working on a functionally different and non-complementary structure than the original one under test. We explain hereafter why this fact is interesting. Suppose that the logic circuit we want to check is a contingency but algorithms for tautology (contradiction) are not efficient on it. If we just invert the outputs of this logic circuit and we run algorithms for contradiction (tautology) then we would likely face the same difficulty. However, if we switch AND/ORs in the logic circuit we get a functionally different and non-complementary structure. In this case, algorithms for contradiction (tautology) do not face by construction the same complexity. Exploiting this property, it is possible to speed-up a traditional tautology (contradiction) check problem. Still, Theorem 4.1 guarantees that if the original circuit is a tautology (contradiction) then the AND/OR switched version is a contradiction (tautology) preserving the checking correctness.

Figure 3A:
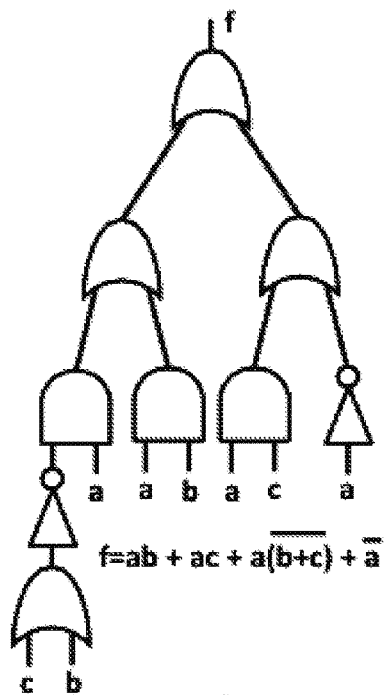
FIGS. 3(a)-3(d) logic circuits examples—{AND, OR, INV} logic circuit representing $f=ab+ac+a\overline{(b+c)}+\overline{a}(a)$. {MAJ, INV} logic circuit emulating the circuit in (a) using constants (b). {AND, OR, INV} logic circuits derived from (a) by switching AND/OR operators (c). {MAJ, INV} logic circuit emulating the circuit in (a) using a fictitious input variable d (d)
Figure 3B:
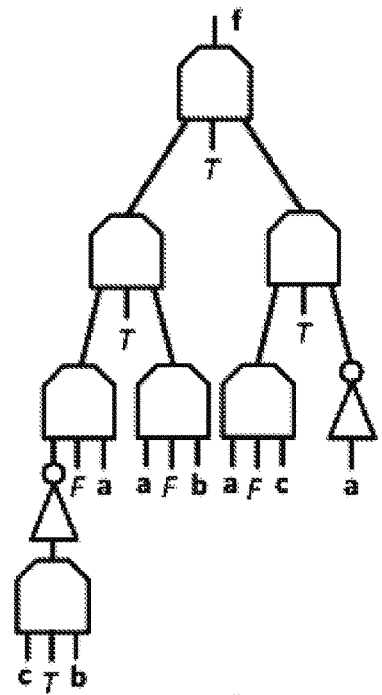
Figure 3C:
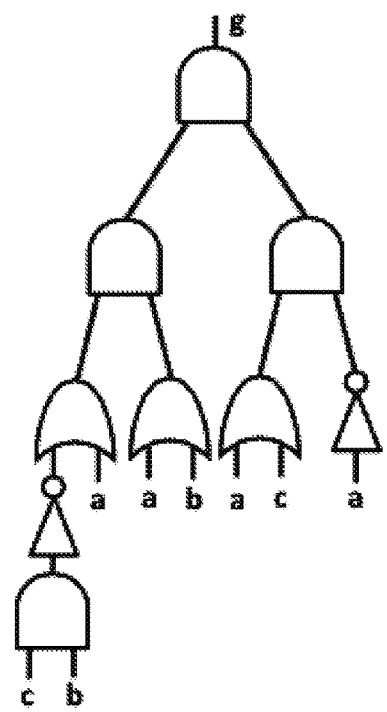
Figure 3D:
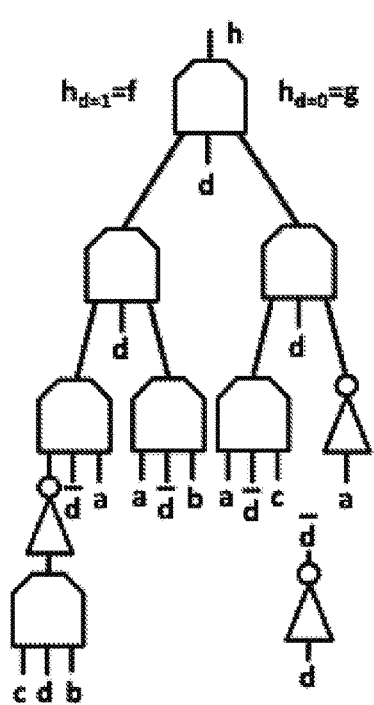

Recalling the example in FIG. 3(a), the original logic cir-cuit represents a tautology. Consequently, the logic circuit in FIG. 3(c) represents a contradiction. These properties are verifiable by hand as the circuits considered are small. For an example which is a contingency, consider the {AND, OR, INV} circuit realization for f=ab'+c' (contingency). By switching AND/ORs, we get g=(a+b') c' which is different from both f or f', as predicted.

We now consider logic circuits with richer basis set functions than just {AND, OR, INV}. Our enlarged basis set includes {AND, OR, INV, MAJ, XOR, XNOR} logic operators. Other operators can always be decomposed into this universal basis set, or new switching rules can be derived. In the following, we extend the applicability of Theorem 4.1.

Theorem 4.2:

let A be a logic circuit over the universal basis set {AND, OR, INV, MAJ, XOR, XNOR} representing a tautology (contradiction). The logic circuit A', obtained by switching logic operators in A as per FIG. 7/Table I, represents a contradiction (tautology).

Proof:

in order to prove the theorem, we need to show the switching rules just for XOR, XNOR and MAJ operators. AND/OR switching is already proved by Theorem 4.1. Consider the XOR operator decomposed in terms of {AND, OR, INV}:

$f=a \oplus b=ab'+a'b.$

Applying the duality in Theorem 4.1 we get $g=(a+b')(a'+b)$ that is indeed equivalent to a XNOR operator. This proves the XOR to XNOR switching and vice versa. Analogously, consider the MAJ operator decomposed in terms of {AND, OR, INV}:

$f=ab+ac+bc.$

Applying the duality in Theorem 4.1 we get $g=(a+b)(a+c)(b+c)$ that is still equivalent to a MAJ operator. Hence, MAJ operators do not need to be modified. Q.E.D.

Note that in a data structure for a computer program, the operator switching task does not require actual pre-processing of the logic circuit. Indeed, each time that a node in the DAG is evaluated an external flag word determines if the regular or switched operator type has to be retrieved from memory.

In the current section, have we shown a non-trivial duality between contradiction and tautology check. In the next section, we study its application on Boolean satisfiability.

EXPERIMENTAL RESULTS

In this section, we exercise our non-trivial duality in Boolean SATisfiability (SAT) problems. First, we describe how to use the tautology/contradiction duality to generate a second (dual) equi-satisfiable SAT instance. Second, we demonstrate that the dual instance can be solved faster than the regular one and the corresponding runtime reduction is not of the random variation type. Third, and last, we show experimental results for a concurrent regular/dual SAT execution scenario.

A. Boolean SAT and Tautology/Contradiction Duality

The Boolean SAT problem consists of determining whether there exists or not an interpretation evaluating to true a Boolean formula or circuit. The Boolean SAT problem is reciprocal to a check for contradiction. When contradiction check fails then Boolean SAT succeeds while when contradiction check succeeds then Boolean SAT fails. Instead of checking for Boolean SAT or for contradiction, one can use a dual transformation in the circuit and check for tautology. Such transformation can be either (i) non-trivial, i.e., switching logic operators in the circuit as per FIG. 7/Table I; or (ii) trivial, i.e., output complementation.

If we use twice any dual transformation, we go back to the original problem domain (contradiction, SAT). Note that if we use twice the same dual transformation (trivial-trivial or non-trivial-non-trivial) we obtain back exactly the original circuit. Instead, if we apply two different dual transformations in sequence (trivial-non-trivial or non-trivial-trivial) we obtain an equi-satisfiable but not necessarily equivalent circuit.

We use the latter approach to generate from the regular a second equi-satisfiable circuit, which we call the dual circuit. This is illustrated in FIG. 5 wherein an arrow points away to a switching rules table in which rules from FIG. 7/Table 1 are applied to the regular (logic) circuit and the dual (logic) circuit obtained as a result.

The dual circuit SAT—see the two tooth wheels entitled "Solver" and "SAT" next to the Dual circuit—is solved in parallel with the regular circuit—see the two tooth wheels entitled "Solver" and "SAT" next to the arrow arriving from the Regular circuit—in a first finishing wins speculative strategy.

Figure 5:
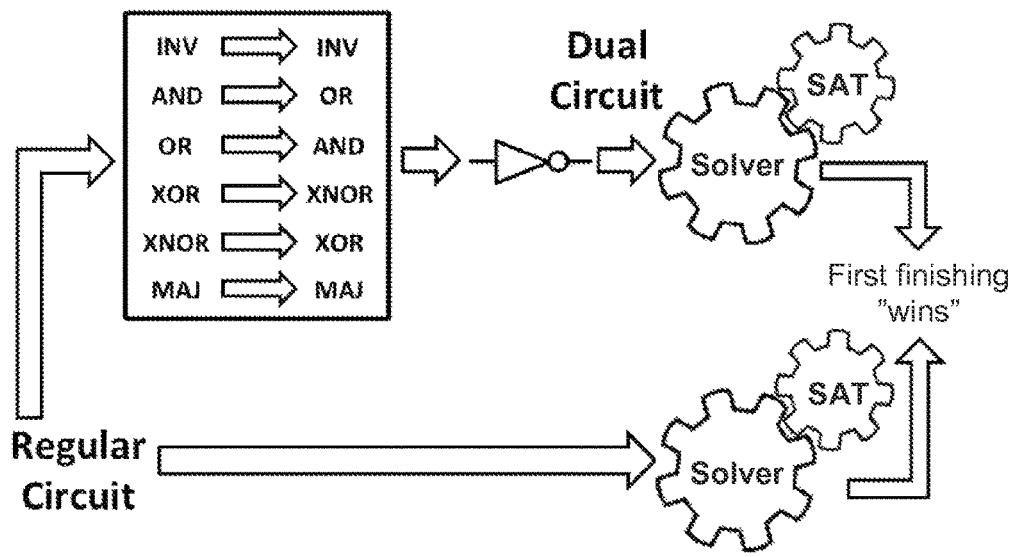
FIG. 5 contains a speculative parallel regular/dual circuit SAT flow.

FIG. 5 depicts the corresponding flow as a whole.

We generate the dual circuit by first applying our non-trivial duality (switching rules in FIG. 7/Table I) and finally complementing the outputs (trivial duality). Note that these operations ideally require no (or very little) computational overhead, as explained previously.

B. Verification of SAT Solving Advantage on the Dual Circuit

Figure 6:
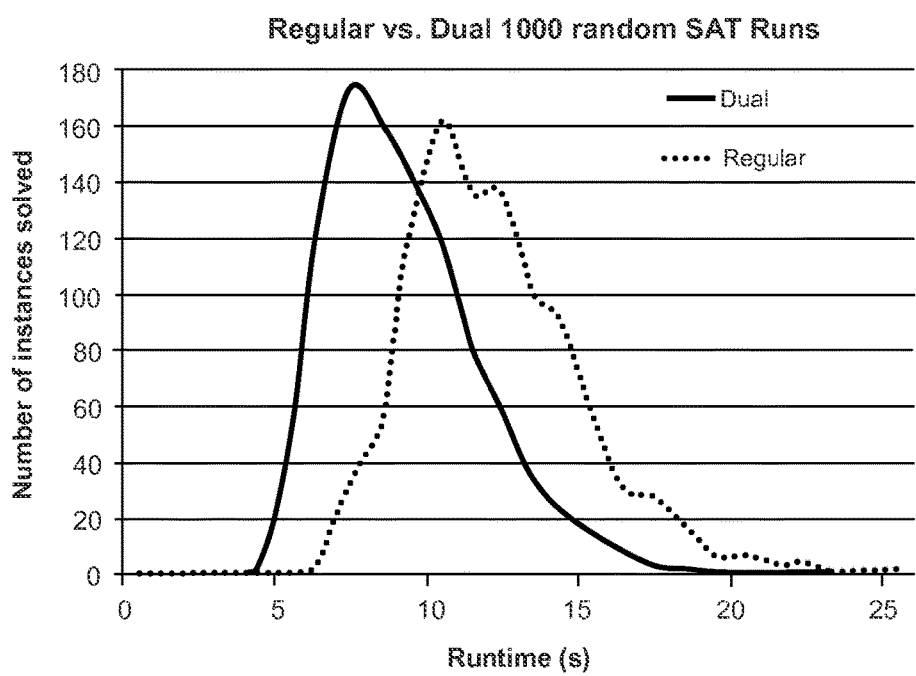
FIG. 6 is graph showing 1000 randomized SAT runs for regular and dual circuit.

In our first set of experiments we focused on verifying whether the dual circuit can be easier to satisfy than the regular circuit. For this purpose, we modified MiniSat-C v1.14.1 [16] to read circuits in AIGER format [18] and to encode them in CNF internally via Tseitin transformation. The dual circuit is generated online during reading if a switch "-p" is given. We considered a large circuit (0.7 M nodes) over 1000 randomized (pseudo-random number generator seed) runs. FIG. 6 shows the runtime distributions for dual and regular SAT.

The dual runtime distribution is clearly left-shifted (but partially overlapping) with respect to the regular runtime distribution. This confirms that (i) the dual circuit can be solved faster than the regular one and (ii) the runtime reduction is not of the random variation type.

C. Results for Concurrent Regular/Dual SAT Execution

In our second set of experiments (downloadable at [19]) we used ABC tool [17] to test our dual approach together with advanced techniques to speed-up SAT. Our custom set of benchmarks is derived by (i) unfolding SAT sequential problems (ii) encoding combinational equivalence check problems. All benchmarks are initially described in Verilog as a netlist of logic gates over the basis {AND, OR, INV, XOR, XNOR, MAJ}. The dual circuits are obtained by applying switching rules in FIG. 7/Table I and inverting the output. The ABC script to read and run SAT on these benchmarks is:
read library.genlib;
r -m input.v; st;
write out.aig;
&r out.aig;
&ps;
&write cnf -K 4 out.cnf;
dsat -p out.cnf.
  Apart from standard I/O commands, note that
  &write cnf -K 4 out.cnf
generates a CNF using a technology mapping procedure and
  dsat -p
calls MiniSat with variable polarity alignment.

FIG. 8/Table II shows results for regular vs. dual SAT solving with our setup. For about half of the benchmarks (7/13) the dual instance concluded first while for the remaining ones (6/13) the regular instance was faster. The total regular runtime is quite close to the total dual runtime (just 6% of deviation). However, considering here the speculative parallel SAT flow in FIG. 5, we can ideally reduce the total runtime by about 25%. Note that this is an ideal projection into a parallel execution environment, with no overhead. We experimentally verified that the average overhead can be small (few percentage points) thanks to the intrinsic independence of the two tasks.

CONCLUSION

In this description, we have shown a non-trivial duality between tautology and contradiction check to speed up circuit SAT. On the one hand, tautology check determines if a logic circuit is true for all input combinations. On the other hand, contradiction check determines if a logic circuit is false for all input combinations. A trivial transformation of a (tautology, contradiction) check problem into a (contradiction, tautology) check problem is the inversion of all the outputs in a logic circuit. In this work, we proved that exact logic inversion is not necessary. By switching logic operator types in a logic circuit, following the rules presented in this paper, we can selectively exchange tautologies with contradictions. Our approach is equivalent to logic inversion just for tautology and contradiction extreme points. It generates non-complementary logic circuits in the other cases. Such property enables computing benefits when an alternative but equi-solvable instance is easier to solve than the original one. As a case study, we studied the impact on SAT. There, our methodology generated a dual SAT instance solvable in parallel with the original one. This concept can be used on top of any other SAT approach and does not impose much overhead, except having to run two solvers instead of one, which is typically not a problem because multi-cores are widespread and computing resources are inexpensive. Experimental results shown 25% speed-up of SAT in a concurrent execution scenario.

REFERENCES

[1] G. De Micheli, Synthesis and Optimization of Digital Circuits, McGraw-Hill, New York, 1994.
[2] T. Sasao, Switching Theory for Logic Synthesis, Springer, 1999.
[3] M. R. Garey, D. S. Johnson, Computers and Intractability—A Guide to the Theory of NP-Completeness. W. H. Freeman and Company, 1979. [4] A. E. Hyvarinen, et al., Incorporating clause learning in grid-based randomized SAT solving, Journal on SAT (JSAT) 6, 223-244, 2009.
[5] R. K. Brayton, Logic minimization algorithms for VLSI synthesis, Vol. 2. Springer, 1984.
[6] R. Rudell, A. Sangiovanni-Vincentelli Multiple-valued Minimization far PLA Optimization, IEEE Trans. on CAD of ICs and Syst. 6.5: 727-750, 1987
[7] G. Hachtel, F. Somenzi, Logic synthesis and verification algorithms. Springer, 2006.
[8] L. Benini, G. De Micheli, A survey of Boolean matching techniques for library binding, ACM Transaction on DAES (TODAES), 2(3), 193-226, 1997.
[9] G. D. Hachtel, M. J. Reily, Verification algorithms for VLSI synthesis, IEEE Trans. on CAD of ICs and Syst. 7.5: 616-640, 1980
[10] G. Stalmarck, A system for determining propositional logic theorems by applying values and rules to triplets that are generated from a formula, Swedish Patent No. 467, 076 (approved 1992); U.S. Pat. No. 5,276,897 (approved 1994); European Patent No. 403,454 (approved 1995).
[11] R. E. Bryant, Graph-based algorithms for Boolean function manipulation, IEEE Trans. on Comp., C-35(8): 677-691, 1986.
[12] S. Malik, A. R. Wang, R. K. Brayton, A. Sangiovanni-Vincentelli, Logic verification using binary decision diagrams in a logic synthesis environment, Proc. ICCAD, 1988.
[13] C. P. Gomes, H. Kautz, A. Sabharwal, B. Selman, Satisfiability solvers, Handbook of Knowledge Representation 3 (2008): 89-134.
[14] The international SAT Competitions web page, available online
[15] L. Amaru, P.-E. Gaillardon, G. De Micheli, Majority-Inverter Graph: A Novel Data-Structure and Algorithms for Efficient Logic Optimization, Proc. DAC, 2014.
[16] MiniSat SAT solver available online
[17] Berkeley Logic Synthesis and Verification Group, ABC: A System for Sequential Synthesis and Verification, available online

[18] AIGER benchmarks available online
[19] INTEGRATED SYSTEMS LABORATORY LSI available online.

The invention claimed is:

1. A method for transforming a tautology check of an original logic circuit into a contradiction check of the original logic circuit and vice versa, the method comprising:
   interpreting the original logic circuit in terms of AND, OR, MAJORITY, MINORITY, XOR, XNOR, INV original logic operators;
   transforming the original circuit obtained from the interpreting, into a dual logic circuit enabled for a checking of contradiction in place of tautology and vice versa, by
      providing a set of switching rules configured to switch each respective one of the original logic operators INV, AND, OR, MAJORITY, XOR, XNOR, MINORITY into a respective switched logic operator INV, OR, AND, MAJORITY, XNOR, XOR, MINORITY; and
      complementing outputs of the original circuit by adding an INV at each output wire;
   testing in parallel
      the satisfiability of the original logic circuit, and
      the satisfiability of the dual logic circuit with inverted outputs;
      and
   responsive to one of the parallel tests finishing, causing the other parallel test to also stop; and
   generating a circuit corresponding to the testing.

2. The method of claim 1, further comprising responsive to testing that confirms the satisfiability of the original logic circuit and the satisfiability of the dual logic circuit with inverted outputs, configuring the transformed logic for use in a computer system.

3. A method of making a new circuit including transforming a tautology check of an original logic circuit into a contradiction check of the original logic circuit and vice versa, the method comprising:
   interpreting the original logic circuit in terms of AND, OR, MAJORITY, MINORITY, XOR, XNOR, INV original logic operators;
   transforming the original circuit obtained from the interpreting, into a dual logic circuit enabled for a checking of contradiction in place of tautology and vice versa, by
      providing a set of switching rules configured to switch each respective one of the original logic operators INV, AND, OR, MAJORITY, XOR, XNOR, MINORITY into a respective switched logic operator INV, OR, AND, MAJORITY, XNOR, XOR, MINORITY; and
      complementing outputs of the original circuit by adding an INV at each output wire;
   testing in parallel a first test and a second test
      the first test testing the satisfiability of the original logic circuit, and
      the second test testing the satisfiability of the dual logic circuit with inverted outputs;
      and
   responsive to either one of the first test and second test finishing, causing the other test to also stop; and
   generating the new circuit corresponding to the testing.

4. The method of claim 3, further comprising responsive to testing that confirms the satisfiability of the original logic circuit and the satisfiability of the dual logic circuit with inverted outputs, configuring the transformed logic for use in a computer system.

* * * * *